(12) United States Patent
Soh (10) Patent No.: US 7,839,177 B1
(45) Date of Patent: Nov. 23, 2010

(54) TECHNIQUES FOR PHASE DETECTION WITH FAST RESET

(75) Inventor: Lip Kai Soh, Sitiawan (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/266,935

(22) Filed: Nov. 7, 2008

(51) Int. Cl.
*G01R 25/00* (2006.01)
*H03D 13/00* (2006.01)

(52) U.S. Cl. ............... 327/3; 327/5; 327/7; 327/10; 331/25

(58) Field of Classification Search ............ 327/2, 327/3, 5, 7–10, 12; 331/25
See application file for complete search history.

(56) References Cited

U.S. PATENT DOCUMENTS

| | | | |
|---|---|---|---|
| 4,291,274 A | | 9/1981 | Suzuki et al. |
| 5,308,778 A | * | 5/1994 | Fitch et al. .................. 438/128 |
| 5,661,419 A | * | 8/1997 | Bhagwan ....................... 327/8 |
| 5,663,685 A | | 9/1997 | Kesner |
| 5,815,041 A | * | 9/1998 | Lee et al. ....................... 331/8 |
| 6,683,478 B2 | | 1/2004 | Yoo |
| 7,053,666 B2 | * | 5/2006 | Tak et al. ....................... 327/3 |
| 7,564,315 B2 | * | 7/2009 | Fernandez .................... 331/25 |
| 7,750,683 B2 | * | 7/2010 | Huang et al. ................. 327/12 |
| 2007/0018705 A1 | | 1/2007 | Riley |
| 2010/0019802 A1 | * | 1/2010 | Huang et al. .................... 327/8 |

OTHER PUBLICATIONS

Sungjoon Kim, et al.; "A 960-Mb/s/pin Interface for Skew-Tolerant Bus Using Low Jitter PLL", IEEE Journal of Solid-State Circuits, vol. 32, May 1997, pp. 691-700.
Mehmet Soyuer, et al., "Frequency Limitations of a Conventional Phase-Frequency Detector," IEEE Journal of Solid-State Circuits, vol. 25, No. 4, Aug. 1990, pp. 1019-1022.

* cited by examiner

*Primary Examiner*—Lincoln Donovan
*Assistant Examiner*—Patrick O'Neill
(74) *Attorney, Agent, or Firm*—Steven J. Cahill (57) ABSTRACT

A phase detector includes transistors that generate first and second phase error signals. The phase detector resets the first phase error signal in response to at least one of the first and the second phase error signals through a first reset path having a maximum reset delay that is equal to or less than a sum of switching delays of three transistors in the first reset path. The phase detector resets the second phase error signal in response to at least one of the first and the second phase error signals through a second reset path having a maximum reset delay that is equal to or less than a sum of switching delays of three transistors in the second reset path.

24 Claims, 5 Drawing Sheets

TECHNIQUES FOR PHASE DETECTION WITH FAST RESET

BACKGROUND OF THE INVENTION

The present invention relates to electronic circuits, and more particularly, to techniques for phase detection with fast reset.

Locked loop circuits include delay-locked loop circuits and phase-locked loop circuits. Locked loop circuits can be used to generate periodic clock signals. Locked loop circuits typically include a phase detector that compares a reference clock signal to a feedback clock signal to generate one or more phase error signals.

BRIEF SUMMARY OF THE INVENTION

According to some embodiments of the present invention, a phase detector includes transistors that generate first and second phase error signals. The phase detector resets the first phase error signal in response to at least one of the first and the second phase error signals through a first reset path having a maximum reset delay that is equal to or less than a sum of switching delays of three transistors in the first reset path. The phase detector resets the second phase error signal in response to at least one of the first and the second phase error signals through a second reset path having a maximum reset delay that is equal to or less than a sum of switching delays of three transistors in the second reset path.

Various objects, features, and advantages of the present invention will become apparent upon consideration of the following detailed description and the accompanying drawings.

DETAILED DESCRIPTION OF THE INVENTION

Figure 1:
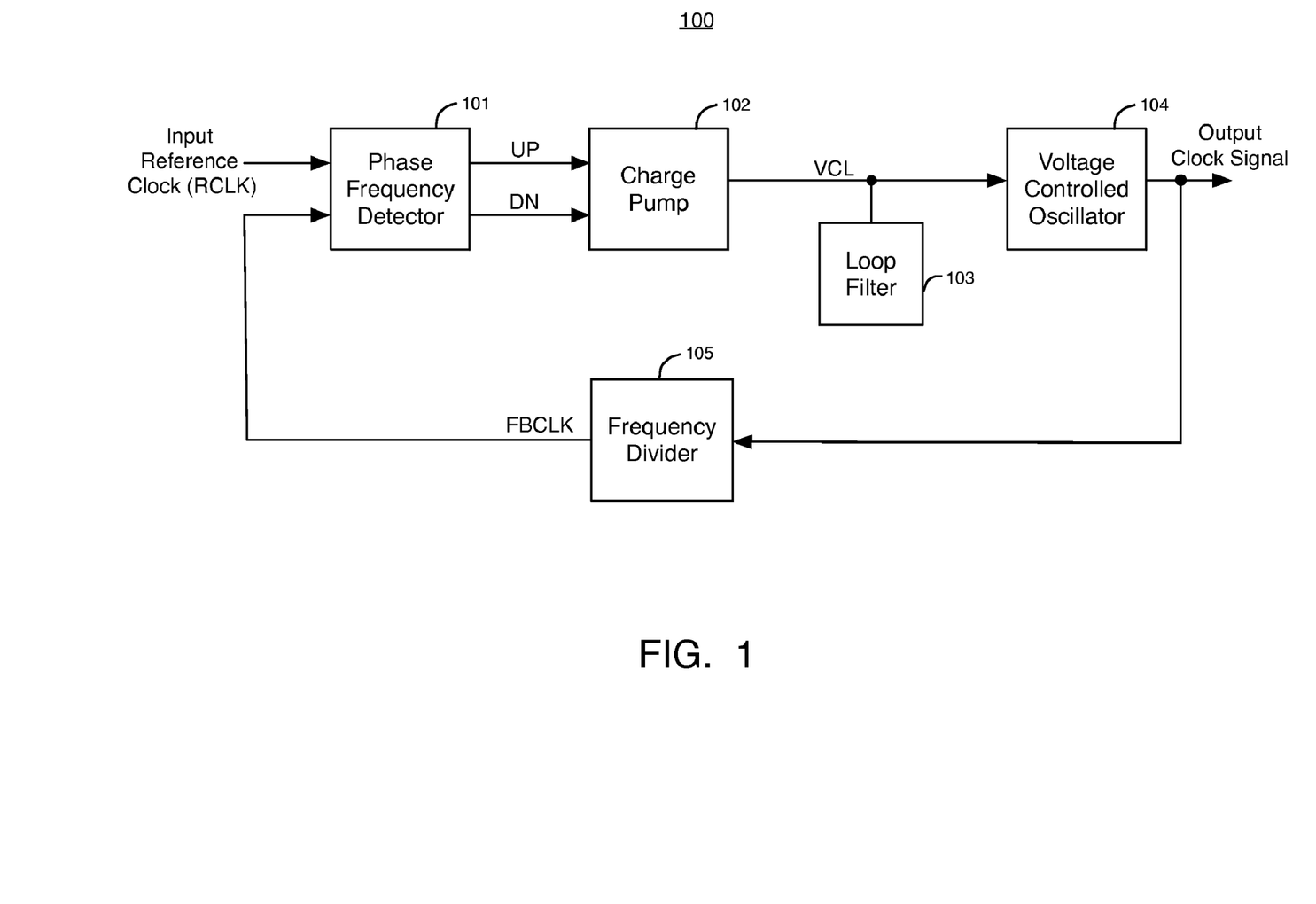
FIG. 1 illustrates an example of a phase-locked loop (PLL) circuit that can include embodiments of the present invention.

FIG. 1 illustrates an example of a phase-locked loop (PLL) circuit 100 that can include embodiments of the present invention. PLL 100 includes phase frequency detector (PFD) circuit 101, charge pump (CP) circuit 102, loop filter (LF) circuit 103, voltage-controlled oscillator (VCO) circuit 104, and frequency divider circuit 105. PLL 100 is one example of a PLL that can include embodiments of the present invention. It should be understood that embodiments of the present invention can be used with PLLs having numerous other configurations.

PLL 100 is typically fabricated on an integrated circuit. A PLL can, for example, be fabricated on an application specific integrated circuit (ASIC) or on a programmable logic integrated circuit, such as a field programmable gate array (FPGA).

An input reference clock signal RCLK is transmitted to a first input terminal of phase frequency detector (PFD) circuit 101. PFD 101 compares the phase and the frequency of reference clock signal RCLK to the phase and the frequency of a feedback clock signal FBCLK to generate pulses in UP and DN output phase error signals.

The UP and DN signals are transmitted to input terminals of charge pump (CP) circuit 102. Charge pump (CP) 102 controls its output control voltage VCL in response to the UP and DN signals. The output control voltage VCL of charge pump 102 is low pass filtered by loop filter (LF) circuit 103. CP 102 sends charge to loop filter 103 in response to logic high pulses in the UP signal. CP 102 drains charge from loop filter 103 in response to logic high pulses in the DN signal.

The control voltage VCL filtered by LF block 103 is transmitted to an input terminal of voltage-controlled oscillator (VCO) circuit 104. VCO 104 generates a periodic output clock signal in response to control voltage VCL. The output clock signal of VCO 104 is transmitted to frequency divider circuit 105. Frequency divider circuit 105 divides the frequency of the output clock signal of VCO 104 by a frequency division value to generate the frequency divided feedback clock signal FBCLK. As a result, the frequency of FBCLK is less than the frequency of the output clock signal of VCO 104.

PFD 101 generates logic high pulses in the UP signal that are longer than the logic high pulses in the DN signal when the frequency of reference clock signal RCLK is greater than the frequency of feedback clock signal FBCLK. When logic high pulses in the UP signal are longer than logic high pulses in the DN signal, CP 102 increases control voltage VCL, causing the frequency of the output clock signal of VCO 104 to increase, which causes the frequency of the FBCLK signal to increase.

PFD 101 generates logic high pulses in the DN signal that are longer than the logic high pulses in the UP signal when the frequency of feedback clock signal FBCLK is greater than the frequency of reference clock signal RCLK. When logic high pulses in the DN signal are longer than logic high pulses in the UP signal, CP 102 decreases control voltage VCL, causing the frequency of the output clock signal of VCO 104 to decrease, which causes the frequency of the FBCLK signal to decrease.

VCO 104 varies the frequency of its output clock signal in response to changes in the control voltage VCL, until reference clock signal RCLK and feedback clock signal FBCLK are frequency and phase aligned. PLL 100 is in lock mode when reference clock signal RCLK and feedback clock signal FBCLK have the same frequency and phase.

In recent years, the speed of communications systems has increased significantly. A phase-locked loop (PLL) circuit is often needed to support a high-speed transceiver in a communications system. In order to support a high-speed system, functional blocks that can operate at a higher frequency are used in the PLL, without compromising the quality of the output signals. Some embodiments of the present invention provide a high-speed phase frequency detector (PFD) that increases the operating frequency of the PLL. The maximum frequency $F_{MAX}$ of the PLL is determined by the formula $F_{MAX}=1/(2\Delta R)$, where $\Delta R$ is the delay of the reset path of the PFD. The delay of the reset path of the PFD is also referred to as the reset time of the PFD. According to some embodiments of the present invention, the reset time of the PFD is reduced to increase the maximum frequency of the PFD and the maximum frequency of the PLL.

Figure 2:
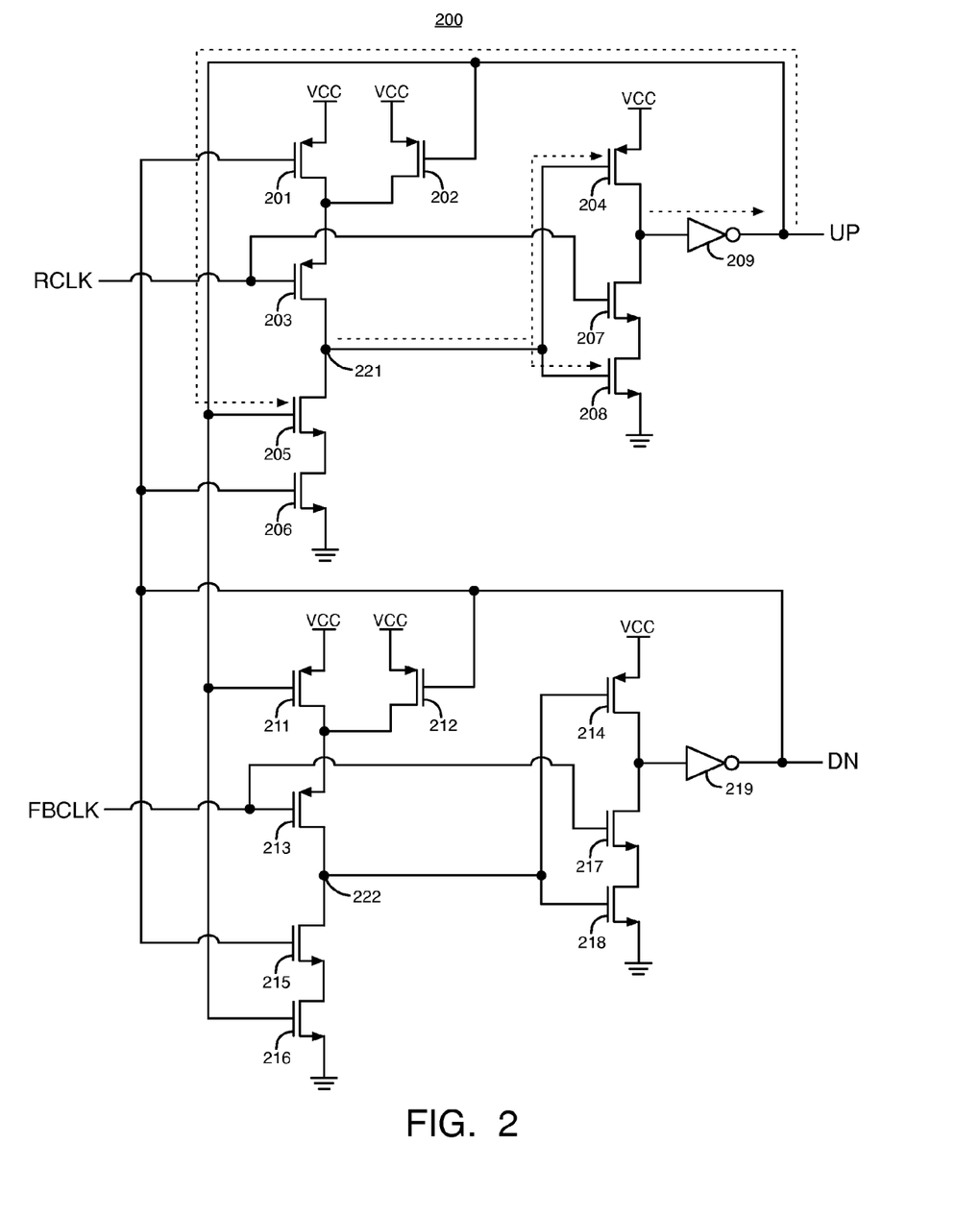
FIG. 2 illustrates an example of a phase frequency detector circuit, according to an embodiment of the present invention.

FIG. 2 illustrates an example of a phase frequency detector circuit 200, according to an embodiment of the present invention. Phase frequency detector (PFD) circuit 200 illustrated in FIG. 2 includes p-channel field-effect transistors (FETs) 201-204 and 211-214, n-channel FETs 205-208 and 215-218, and CMOS inverters 209 and 219. Transistors 201-208 and 211-218 can be, for example, metal oxide semiconductor FETs (i.e., MOSFETs). Each of the inverters 209 and 219 includes a p-channel FET coupled in series with an n-channel FET between a terminal that receives a supply voltage and a terminal that receives a ground voltage. PFD 200 is an example of PFD 101 shown in FIG. 1. Thus, PFD 200 can be used in PLL 100.

Transistors 201, 203, 205, and 206 are coupled in series between a terminal that receives a supply voltage VCC and a terminal that receives a ground voltage. Transistors 201 and 202 are coupled together in parallel. The sources of transistors 201 and 202 are coupled to the VCC supply voltage terminal. Transistors 204, 207, and 208 are coupled together in series between the VCC supply voltage terminal and the ground terminal. Inverter 209 is coupled between the drains of transistors 204 and 207 and a first output terminal of PFD 200.

Transistors 211, 213, 215, and 216 are coupled in series between the VCC supply voltage terminal and the ground terminal. The sources of transistors 211 and 212 are coupled to the VCC supply voltage terminal. Transistors 211 and 212 are coupled together in parallel. Transistors 214, 217, and 218 are coupled in series between the VCC supply voltage terminal and the ground terminal. Inverter 219 is coupled between the drains of transistors 214 and 217 and a second output terminal of PFD 200.

The reference clock signal RCLK is transmitted to the gate terminal of p-channel transistor 203 and to the gate terminal of n-channel transistor 207. The feedback clock signal FBCLK is transmitted to the gate terminal of p-channel transistor 213 and to the gate terminal of n-channel transistor 217. The UP phase error signal is generated at the output terminal of inverter 209, and the DN phase error signal is generated at the output terminal of inverter 219. The UP and DN signals are digital output signals of PFD 200. The UP signal is transmitted to the gate terminals of transistors 202, 205, 211, and 216. The DN signal is transmitted to the gate terminals of transistors 212, 201, 206, and 215.

According to an alternative embodiment of PFD 200, the reference clock signal RCLK is transmitted to the gate terminals of transistors 213 and 217, and the feedback clock signal FBCLK is transmitted to the gate terminals of transistors 203 and 207. In this embodiment, the UP phase error signal is generated at the output terminal of inverter 219, and the DN phase error signal is generated at the output terminal of inverter 209. Also, in this embodiment, the UP signal is transmitted to the gate terminals of transistors 212, 215, 201, and 206, and the DN signal is transmitted to the gate terminals of transistors 202, 211, 216, and 205.

The operation of phase frequency detector (PFD) 200 is now described in detail. In this discussion, it is assumed that clock signals RCLK and FBCLK are both initially in logic low states, and the UP and DN output signals of PFD 200 are both initially in logic low states. Also in this discussion, it is assumed that RCLK is transmitted to transistors 203 and 207, FBCLK is transmitted to transistors 213 and 217, the UP signal is generated at the output terminal of inverter 209, and the DN signal is generated at the output terminal of inverter 219, as shown in FIG. 2.

When RCLK is in a logic low state, p-channel transistor 203 is on, and n-channel transistor 207 is off. When UP is in a logic low state, p-channel transistors 202 and 211 are on, and n-channel transistors 205 and 216 are off. When FBCLK is in a logic low state, p-channel transistor 213 is on, and n-channel transistor 217 is off. When DN is in a logic low state, p-channel transistors 201 and 212 are on, and n-channel transistors 206 and 215 are off. Transistors 201-203 pull the voltage at node 221 to supply voltage VCC (i.e., a logic high state), causing transistor 204 to be off and transistor 208 to be on.

In PLL 100, the phase of FBCLK may be ahead of RCLK, behind RCLK, or aligned with RCLK. According to one example that is now described in detail, the phase of FBCLK occurs later in time than the phase of RCLK. In this example, RCLK transitions to a logic high state before FBCLK transitions to a logic high state. When RCLK transitions to a logic high state, transistor 203 turns off, and transistor 207 turns on. Transistors 207-208 then pull the voltage at the input terminal of inverter 209 to ground (i.e., a logic low state). In response to a logic low state at its input terminal, inverter 209 pulls the UP signal to a logic high state. When the UP signal transitions high, transistors 202 and 211 turn off, and transistors 205 and 216 turn on.

While FBCLK and DN are in logic low states, transistors 212-213 pull the voltage at node 222 to supply voltage VCC, causing transistor 214 to be off and transistor 218 to be on. When FBCLK transitions to a logic high state after RCLK transitions to a logic high state, transistor 213 turns off, and transistor 217 turns on. Transistors 217-218 then pull the voltage at the input terminal of inverter 219 to ground. In response to a logic low state at its input terminal, inverter 219 pulls the DN signal to a logic high state. When the DN signal transitions high, transistors 201 and 212 turn off, and transistors 206 and 215 turn on.

Transistors 205 and 206 are on at the same time after DN transitions high. When transistors 205-206 are on, transistors 205-206 pull the voltage at node 221 to ground, turning transistor 204 on and turning transistor 208 off. Transistor 204 then pulls the voltage at the input terminal of inverter 209 to VCC. In response to VCC at its input terminal, the n-channel transistor in inverter 209 pulls UP to a logic low state.

Transistors 215 and 216 are also on at the same time after DN transitions high. When transistors 215-216 are on, transistors 215-216 pull the voltage at node 222 to ground, turning transistor 214 on and turning transistor 218 off. Transistor 214 then pulls the voltage at the input terminal of inverter 219 to VCC. In response to VCC at its input terminal, the n-channel transistor in inverter 219 pulls DN to a logic low state.

In general, PFD 200 begins the process of resetting when both the UP and DN signals are in logic high states at the same time. PFD 200 is reset when the logic high pulses in the UP and DN signals end, and both the UP and DN signals transition back to logic low states. The UP and DN signals both transition from a logic high state to a logic low state (i.e., high-to-low) at the same time. Although, the UP and DN signals may transition low at slightly different times due to transistor mismatches.

Because FBCLK transitions from a logic low state to a logic high state (i.e., low-to-high) after RCLK transitions from low-to-high in the above-described example, PFD 200 begins the process of resetting when DN transitions from low-to-high. When the DN signal transitions high after FBCLK transitions high, the low-to-high transition in DN propagates through transistor 215, then through transistors 214 and 218, and finally through the transistors in inverter 219, which pull DN to a logic low state again. Also, when the DN signal transitions high, the low-to-high transition in DN propagates through transistor 206, then through transistors 204 and 208, and finally through the transistors in inverter 209, which pull UP to a logic low state again. The UP and DN signals are then both in logic low states at the same time.

The low-to-high transition in DN triggers changes in the conductive states of transistor 206, transistors 204 and 208, and the transistors in inverter 209. These changes cause a high-to-low transition in UP. Transistors 206, 204, 208, and the transistors in inverter 209 are in the upper reset path.

The low-to-high transition in DN also triggers changes in the conductive states of transistor 215, transistors 214 and 218, and the transistors in inverter 219. These changes cause a high-to-low transition in DN. Transistors 215, 214, 218, and the transistors in inverter 219 are in the lower reset path.

The low-to-high transition in DN turns transistors 201 and 212 off. However, transistors 203 and 213 are already off, because RCLK and FBCLK are high. Therefore, turning transistors 201 and 212 off does not affect the voltages at nodes 221 and 222, respectively. Transistors 201 and 212 are not in the reset paths.

In this example, the reset delay is the time between the transition in DN from a logic low state to a logic high state and the subsequent transitions in UP and DN back to logic low states. The reset delay for the UP signal equals the sum of the switching delays of three transistors in the upper reset path. In this example, the reset delay of the UP signal equals the switching delay of transistor 206, plus the switching delay of the slowest one of transistors 204 and 208 to switch, plus the switching delay of the slowest transistor to switch in inverter 209.

The reset delay for the DN signal equals the sum of the switching delays of three transistors in the lower reset path. In this example, the reset delay of the DN signal equals the switching delay of transistor 215, plus the switching delay of the slowest one of transistors 214 and 218 to switch, plus the switching delay of the slowest transistor to switch in inverter 219. The switching delay is the time it takes for a transistor that is on to turn off or the time it takes for a transistor that is off to turn on.

According to another example that is now described, the phase of FBCLK is ahead of the phase of RCLK. In this example, FBCLK transitions to a logic high state before RCLK transitions to a logic high state. The voltage at node 222 is initially at VCC. When FBCLK transitions from a logic low state to a logic high state, transistor 213 turns off, and transistor 217 turns on. Transistors 217-218 then pull the voltage at the input terminal of inverter 219 to ground, causing inverter 219 to pull the DN signal from a logic low state to a logic high state. When the DN signal transitions high, transistors 212 and 201 turn off, and transistors 206 and 215 turn on.

While RCLK and UP are in logic low states, transistors 202-203 pull the voltage at node 221 to supply voltage VCC, causing transistor 204 to be off and transistor 208 to be on. When RCLK transitions from a logic low state to a logic high state after FBCLK transitions to a logic high state, transistor 203 turns off, and transistor 207 turns on. Transistors 207-208 then pull the voltage at the input terminal of inverter 209 to ground, causing inverter 209 to pull the UP signal from a logic low state to a logic high state. When the UP signal transitions high, transistors 211 and 202 turn off, and transistors 205 and 216 turn on.

Transistors 215 and 216 are on at the same time after UP transitions high. When transistors 215-216 are on, transistors 215-216 pull the voltage at node 222 to ground, turning transistor 214 on and turning transistor 218 off. Transistor 214 then pulls the voltage at the input terminal of inverter 219 to VCC, causing inverter 219 to pull DN from a logic high state to a logic low state.

Transistors 205 and 206 are also on at the same time after UP transitions high. When transistors 205-206 are on, transistors 205-206 pull the voltage at node 221 to ground, turning transistor 204 on and turning transistor 208 off. Transistor 204 then pulls the voltage at the input terminal of inverter 209 to VCC, causing inverter 209 to pull UP from a logic high state to a logic low state.

Because FBCLK transitions from low-to-high before RCLK transitions from low-to-high, PFD 200 begins the process of resetting after UP transitions from low-to-high. When the UP signal transitions high after RCLK transitions high, the transition to a logic high state in UP propagates through transistor 205, then through transistors 204 and 208, and finally through the transistors in inverter 209, as shown by the dotted lines in FIG. 2, pulling UP to a logic low state again. Also, when the UP signal transitions high, the transition to a logic high state in UP propagates through transistor 216, then through transistors 214 and 218, and finally through the transistors in inverter 219, pulling DN to a logic low state again. The UP and DN signals are then both in logic low states at the same time.

The low-to-high transition in UP triggers changes in the conductive states of transistor 205, transistors 204 and 208, and the transistors in inverter 209. These changes cause a high-to-low transition in UP. Inverter 209 and transistors 205, 204, and 208 are in the upper reset path.

The low-to-high transition in UP also triggers changes in the conductive states of transistor 216, transistors 214 and 218, and the transistors in inverter 219. These changes cause a high-to-low transition in DN. Inverter 219 and transistors 216, 214, and 218 are in the lower reset path.

The low-to-high transition in UP turns transistors 202 and 211 off. However, transistors 203 and 213 are already off, because RCLK and FBCLK are high. Therefore, turning transistors 202 and 211 off does not affect the voltages at nodes 221 and 222, respectively. Transistors 202 and 211 are not in the reset paths.

In this example, the reset delay is the time between the low-to-high transition in UP and the subsequent high-to-low transitions in UP and DN. The reset delay for the UP signal equals the sum of the switching delays of three transistors in the upper reset path. In this example, the reset delay for the UP signal equals the switching delay of transistor 205, plus the switching delay of the slowest one of transistors 204 and 208 to switch, plus the switching delay of the slowest transistor to switch in inverter 209.

The reset delay for the DN signal equals the sum of the switching delays of three transistors in the lower reset path. In this example, the reset delay of the DN signal equals the switching delay of transistor 216, plus the switching delay of the slowest one of transistors 214 and 218 to switch, plus the switching delay of the slowest transistor to switch in inverter 219.

The reset delay in PFD 200 is less than many prior art PFD designs, because the reset delay for each of the UP and DN signals equals the sum of the switching delays of only three transistors. Because the reset delay of PFD 200 is reduced, PFD 200 can generate pulses in the UP and DN signals that are responsive to input clock signals (RCLK and FBCLK) having larger frequencies. As a result, PFD 200 can be used in a high-speed PLL that is designed to generate a high frequency output clock signal from the VCO.

PFD 200 also reduces the output jitter of PLL 100 compared to many prior art PFD designs, because PFD 200 has a reduced reset delay. The delays of the upper and lower reset paths in PFD 200 are directly proportional to the amount of output jitter in the VCO output clock signal that is caused by PFD 200. PLL 100 can generate a higher quality VCO output clock signal, because PFD 200 generates less jitter, which is important in a high-speed PLL circuit.

A dead zone in PFD 200 and a current mismatch in charge pump 102 may cause output jitter in the VCO output clock signal. The dead zone of a PFD is the minimum phase error that the PFD can detect between the two input clock signals. If the phase difference between RCLK and FBCLK is smaller than the dead zone, PFD 200 cannot detect the phase difference. As a result, the UP and DN phase error signals do not indicate the phase difference, resulting in a phase error between input clock signals RCLK and FBCLK.

PFD 200 has a reduced dead zone compared to many prior art PFD designs, because PFD 200 has a reduced reset delay. PFD 200 can detect smaller phase differences between input clock signals RCLK and FBCLK. In addition, the minimum pulse widths of the UP and DN output signals of PFD 200 are reduced, because PFD 200 has a reduced reset delay.

Figure 3:
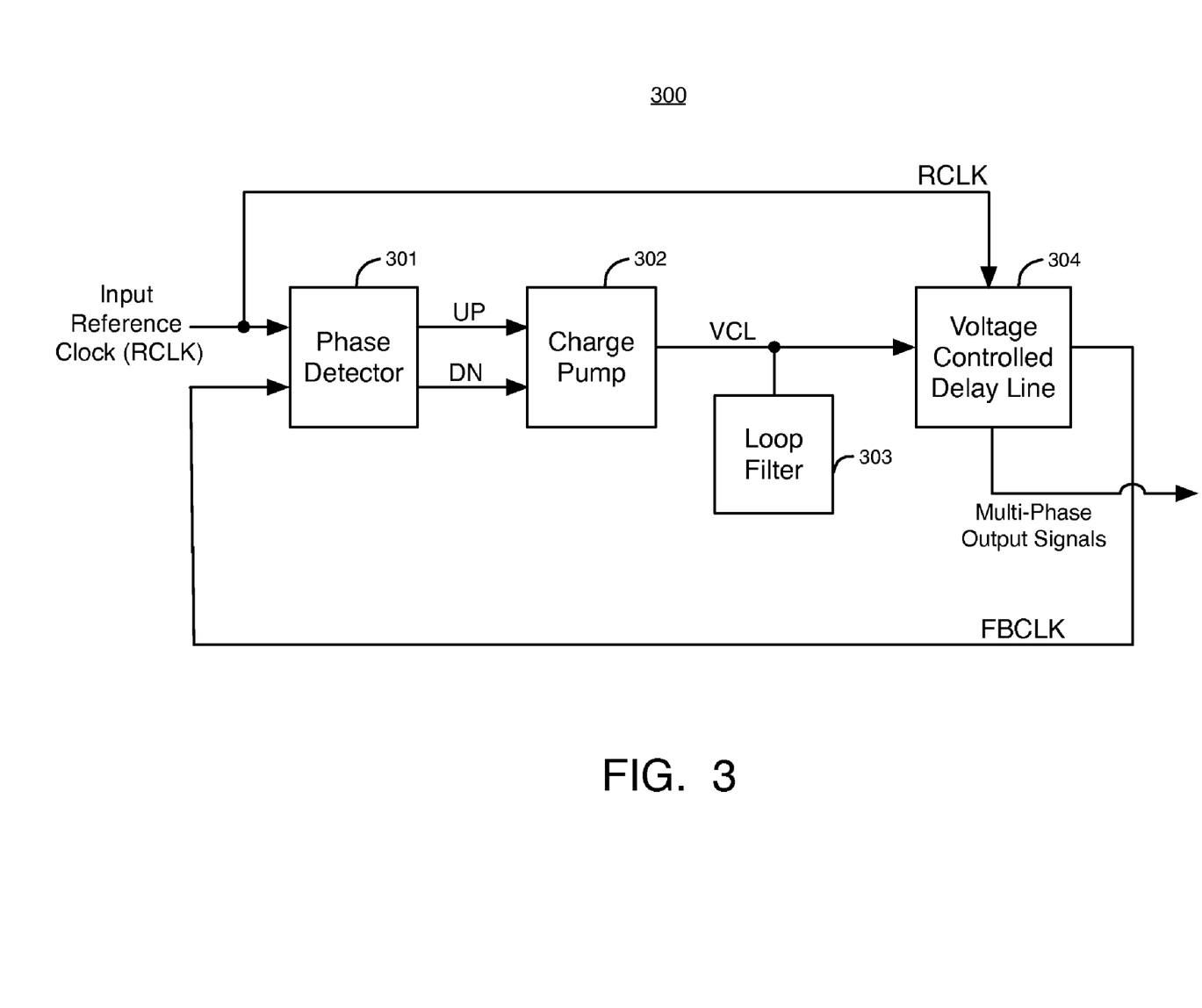
FIG. 3 illustrates an example of a delay-locked loop (DLL) that can include embodiments of the present invention.

FIG. 3 illustrates an example of a delay-locked loop (DLL) 300 that can include embodiments of the present invention. DLL 300 is one example of a DLL that can include embodiments of the present invention. It should be understood that embodiments of the present invention can be used with DLLs having numerous other configurations. DLL 300 is typically fabricated on an integrated circuit such as an ASIC or an FPGA.

Delay-locked loop 300 is a feedback loop circuit that includes a phase detector circuit 301, a charge pump circuit 302, a loop filter circuit 303, and a voltage-controlled delay line (VCDL) circuit 304. PFD 200 shown in FIG. 2 is an example of a phase detector circuit that can be used to implement phase detector 301 in DLL 300.

Phase detector 301 compares an input reference clock signal RCLK to a feedback clock signal FBCLK that has the same frequency as RCLK. Because the frequencies of RCLK and FBCLK are the same, phase detector 301 only compares the phases of these two clock signals.

Phase detector 301 generates UP and DN phase error signals that are indicative of the difference between the phases of RCLK and FBCLK. The UP and DN phase error signals are transmitted to charge pump 302. Charge pump 302 converts the UP and DN phase error signals into a control voltage VCL, as described above with respect to CP 102.

Loop filter 303 is coupled to the output terminal of charge pump 302 and an input terminal of VCDL 304. Loop filter 303 is a low pass filter that filters high frequency signals in the control voltage VCL.

Voltage-controlled delay line (VCDL) 304 includes a set of delay circuits that are coupled together in series to form a delay chain. The delay circuits in VCDL 304 delay the reference clock signal RCLK to generate the feedback clock signal FBCLK. VCDL 304 sets the delay of the delay circuits in the delay chain in response to the control voltage VCL. VCDL 304 adjusts the phase of FBCLK in response to each change in the voltage of control voltage VCL, until the phase of FBCLK is aligned with the phase of RCLK at PD 301. VCDL 304 also generates a set of output clock signals that have multiple phases.

Figure 4:
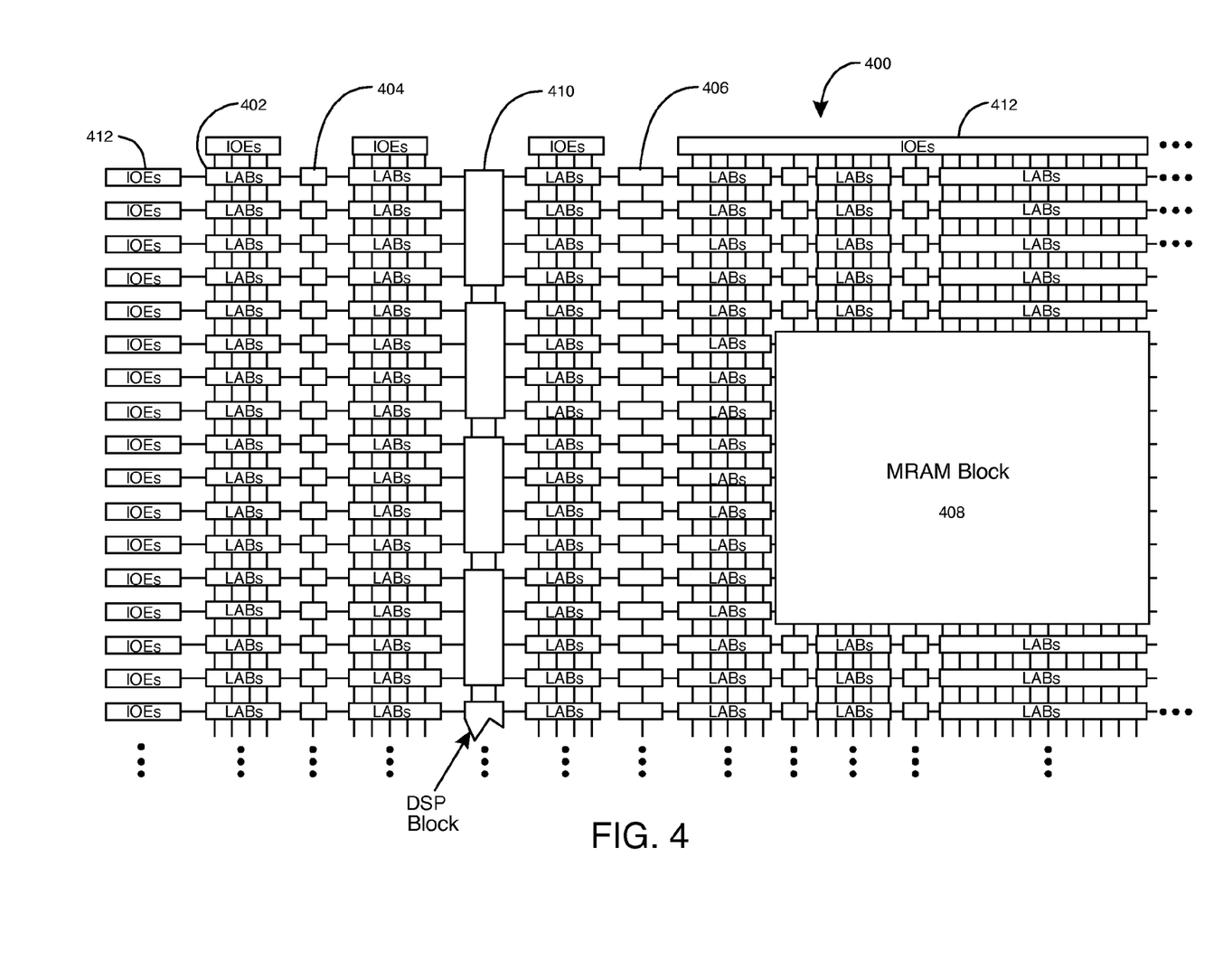
FIG. 4 is a simplified partial block diagram of a field programmable gate array (FPGA) that can include aspects of the present invention.

FIG. 4 is a simplified partial block diagram of a field programmable gate array (FPGA) 400 that can include aspects of the present invention. FPGA 400 is merely one example of an integrated circuit that can include features of the present invention. It should be understood that embodiments of the present invention can be used in numerous types of integrated circuits such as field programmable gate arrays (FPGAs), programmable logic devices (PLDs), complex programmable logic devices (CPLDs), programmable logic arrays (PLAs), and application specific integrated circuits (ASICs).

FPGA 400 includes a two-dimensional array of programmable logic array blocks (or LABs) 402 that are interconnected by a network of column and row interconnect conductors of varying length and speed. LABs 402 include multiple (e.g., 10) logic elements (or LEs).

An LE is a programmable logic circuit block that provides for efficient implementation of user defined logic functions. An FPGA has numerous logic elements that can be configured to implement various combinatorial and sequential functions. The logic elements have access to a programmable interconnect structure. The programmable interconnect structure can be programmed to interconnect the logic elements in almost any desired configuration.

FPGA 400 also includes a distributed memory structure including random access memory (RAM) blocks of varying sizes provided throughout the array. The RAM blocks include, for example, blocks 404, blocks 406, and block 408. These memory blocks can also include shift registers and first-in-first-out (FIFO) buffers.

FPGA 400 further includes digital signal processing (DSP) blocks 410 that can implement, for example, multipliers with add or subtract features. Input/output elements (IOEs) 412 located, in this example, around the periphery of the chip, support numerous single-ended and differential input/output standards. IOEs 412 include input and output buffers that are coupled to pads of the integrated circuit. The pads are external terminals of the FPGA die that can be used to route, for example, input signals, output signals, and supply voltages between the FPGA and one or more external devices. It is to be understood that FPGA 400 is described herein for illustrative purposes only and that the present invention can be implemented in many different types of PLDs, FPGAs, and ASICs.

Figure 5:
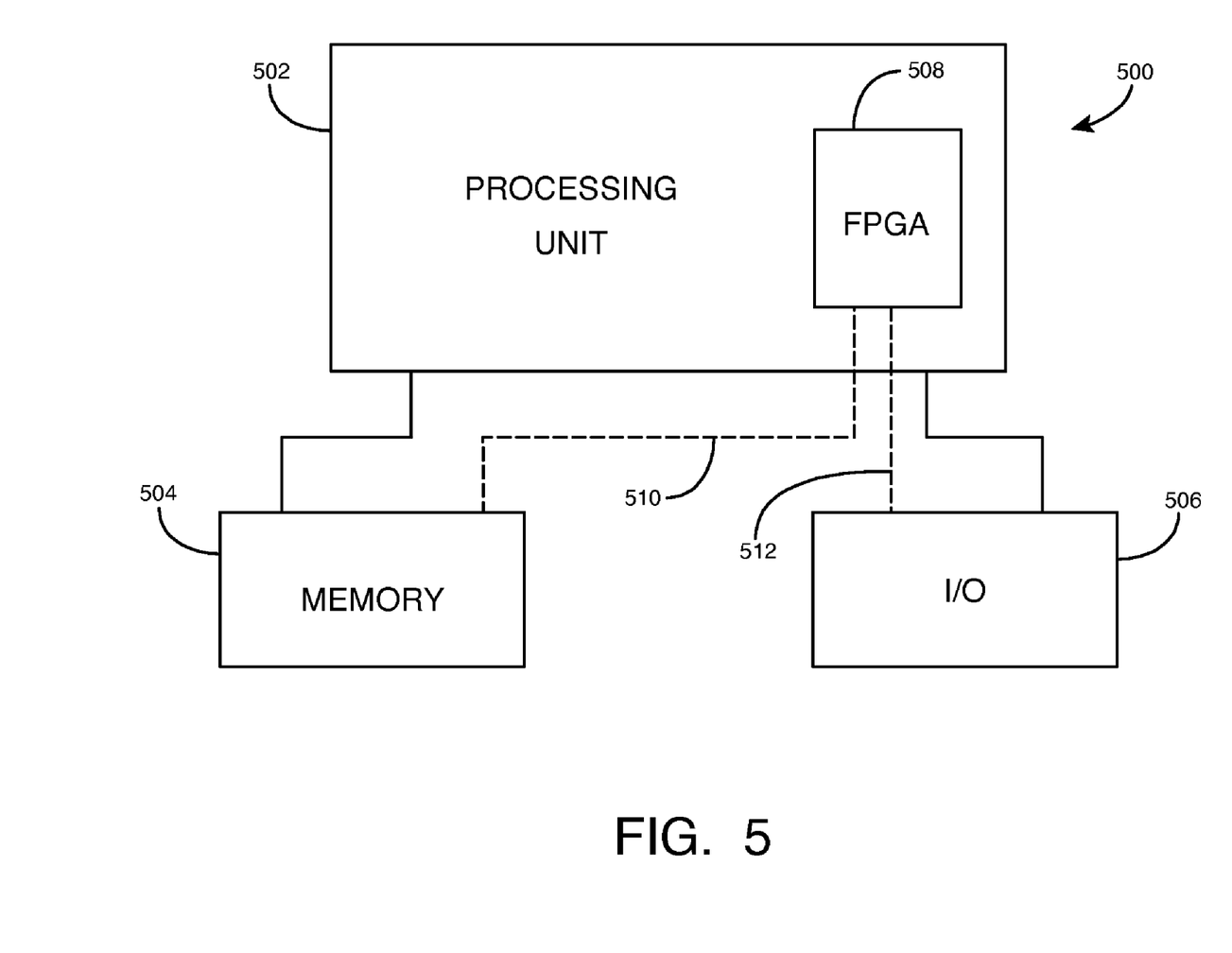
FIG. 5 shows a block diagram of an exemplary digital system that can embody techniques of the present invention.

The present invention can also be implemented in a system that has an FPGA as one of several components. FIG. 5 shows a block diagram of an exemplary digital system 500 that can embody techniques of the present invention. System 500 can be a programmed digital computer system, digital signal processing system, specialized digital switching network, or other processing system. Moreover, such systems can be designed for a wide variety of applications such as telecommunications systems, automotive systems, control systems, consumer electronics, personal computers, Internet communications and networking, and others. Further, system 500 can be provided on a single board, on multiple boards, or within multiple enclosures.

System 500 includes a processing unit 502, a memory unit 504, and an input/output (I/O) unit 506 interconnected together by one or more buses. According to this exemplary embodiment, an FPGA 508 is embedded in processing unit 502. FPGA 508 can serve many different purposes within the system of FIG. 5. FPGA 508 can, for example, be a logical building block of processing unit 502, supporting its internal and external operations. FPGA 508 is programmed to implement the logical functions necessary to carry on its particular role in system operation. FPGA 508 can be specially coupled to memory 504 through connection 510 and to I/O unit 506 through connection 512.

Processing unit 502 can direct data to an appropriate system component for processing or storage, execute a program stored in memory 504, receive and transmit data via I/O unit 506, or other similar functions. Processing unit 502 can be a central processing unit (CPU), microprocessor, floating point coprocessor, graphics coprocessor, hardware controller, microcontroller, field programmable gate array programmed for use as a controller, network controller, or any type of processor or controller. Furthermore, in many embodiments, there is often no need for a CPU.

For example, instead of a CPU, one or more FPGAs 508 can control the logical operations of the system. As another example, FPGA 508 acts as a reconfigurable processor, which can be reprogrammed as needed to handle a particular computing task. Alternatively, FPGA 508 can itself include an embedded microprocessor. Memory unit 504 can be a random access memory (RAM), read only memory (ROM), fixed or flexible disk media, flash memory, tape, or any other storage means, or any combination of these storage means.

The foregoing description of the exemplary embodiments of the present invention has been presented for the purposes of illustration and description. The foregoing description is not intended to be exhaustive or to limit the present invention to the examples disclosed herein. In some instances, features of the present invention can be employed without a corresponding use of other features as set forth. Many modifications, substitutions, and variations are possible in light of the above teachings, without departing from the scope of the present invention.

What is claimed is:

1. A phase detector comprising:
    transistors that generate first and second phase error signals, wherein the phase detector resets the first phase error signal in response to at least one of the first and the second phase error signals through a first reset path, wherein the phase detector resets the second phase error signal in response to at least one of the first and the second phase error signals through a second reset path, wherein a first subset of the transistors are coupled between a supply voltage terminal and a ground terminal, wherein a second subset of the transistors are coupled between a supply voltage terminal and a ground terminal, wherein the first reset path comprises at least one transistor in the first subset and at least one transistor in the second subset, wherein a third subset of the transistors are coupled between a supply voltage terminal and a ground terminal, wherein a fourth subset of the transistors are coupled between a supply voltage terminal and a ground terminal, and wherein the second reset path comprises at least one transistor in the third subset and at least one transistor in the fourth subset;
    a first inverter coupled to an output terminal of the second subset of transistors and to input terminals of the first and the third subsets of transistors, wherein the first reset path comprises the first inverter; and
    a second inverter coupled to an output terminal of the fourth subset of transistors and to input terminals of the first and the third subsets of transistors, wherein the second reset path comprises the second inverter.

2. The phase detector defined in claim 1 wherein the transistors are configured to generate the first and the second phase error signals in response to first and second input clock signals, wherein the phase detector resets the first phase error signal in response to the first and the second phase error signals through the first reset path, and wherein the phase detector resets the second phase error signal in response to the first and the second phase error signals through the second reset path.

3. The phase detector defined in claim 1 wherein the phase detector resets the first phase error signal in response to at least one of the first and the second phase error signals by changing conductive states of six transistors in the first reset path.

4. The phase detector defined in claim 3 wherein the phase detector resets the second phase error signal in response to at least one of the first and the second phase error signals by changing conductive states of six transistors in the second reset path.

5. The phase detector defined in claim 1 wherein the phase detector is a phase frequency detector that is part of a phase-locked loop.

6. The phase detector defined in claim 1 wherein the phase detector is part of a delay-locked loop.

7. The phase detector defined in claim 1 wherein the phase detector is fabricated on a programmable logic integrated circuit.

8. A phase detector comprising:
    first transistors coupled together in series, wherein a first input clock signal, a first phase error signal, and a second phase error signal are routed to input terminals of the first transistors;
    second transistors coupled together in series, wherein the first input clock signal and an output signal of the first transistors are routed to input terminals of the second transistors; and
    a first inverter that generates the first phase error signal in response to an output signal of the second transistors.

9. The phase detector defined in claim 8 further comprising:
    third transistors coupled together in series, wherein a second input clock signal, the first phase error signal, and the second phase error signal are routed to input terminals of the third transistors;
    fourth transistors coupled together in series, wherein the second input clock signal and an output signal of the third transistors are routed to input terminals of the fourth transistors; and
    a second inverter that generates the second phase error signal in response to an output signal of the fourth transistors.

10. The phase detector defined in claim 9 further comprising:
    a first reset path, wherein the phase detector resets the first phase error signal in response to the first and the second phase error signals through the first reset path, and wherein a maximum reset delay through the first reset path is equal to or less than a sum of switching delays of three transistors in the first reset path; and
    a second reset path, wherein the phase detector resets the second phase error signal in response to the first and the second phase error signals through the second reset path, and wherein a maximum reset delay through the second reset path is equal to or less than a sum of switching delays of three transistors in the second reset path.

11. The phase detector defined in claim 10 wherein the phase detector resets the first phase error signal in response to the first and the second phase error signals by changing conductive states of six transistors in the first reset path.

12. The phase detector defined in claim 11 wherein the phase detector resets the second phase error signal in response to the first and the second phase error signals by changing conductive states of six transistors in the second reset path.

13. The phase detector defined in claim 8 wherein the phase detector is fabricated on a programmable logic integrated circuit.

14. The phase detector defined in claim 8 wherein the phase detector is a phase frequency detector in a phase-locked loop.

15. The phase detector defined in claim 8 wherein the phase detector is part of a delay-locked loop.

16. A method for detecting a phase difference, the method comprising:

generating first and second phase error signals in response to first and second input clock signals;

resetting the first phase error signal in response to at least one of the first and the second phase error signals through a first reset path comprising first transistors coupled in series, wherein the first input clock signal, the first phase error signal, and the second phase error signal are provided to inputs of the first transistors; and resetting the second phase error signal in response to at least one of the first and the second phase error signals through a second reset path comprising second transistors coupled in series, wherein the second input clock signal, the first phase error signal, and the second phase error signal are provided to inputs of the second transistors.

17. The method defined in claim 16 wherein resetting the first phase error signal in response to at least one of the first and the second phase error signals further comprises resetting the first phase error signal in response to at least one of the first and the second phase error signals by changing conductive states of six transistors in the first reset path.

18. The method defined in claim 17 wherein resetting the second phase error signal in response to at least one of the first and the second phase error signals further comprises resetting the second phase error signal in response to at least one of the first and the second phase error signals by changing conductive states of six transistors in the second reset path.

19. A phase detector circuit comprising:
first transistors coupled between a supply voltage terminal and a ground terminal;
second transistors coupled between a supply voltage terminal and a ground terminal;
third transistors coupled between a supply voltage terminal and a ground terminal;
fourth transistors coupled between a supply voltage terminal and a ground terminal;
a first inverter coupled to an output terminal of the second transistors and to input terminals of the first and the third transistors, wherein the phase detector circuit generates first and second phase error signals, and wherein the phase detector circuit resets the first phase error signal in response to at least one of the first and the second phase error signals through a first reset path that comprises the first inverter; and
a second inverter coupled to an output terminal of the fourth transistors and to input terminals of the first and the third transistors, wherein the phase detector circuit resets the second phase error signal in response to at least one of the first and the second phase error signals through a second reset path that comprises the second inverter.

20. The phase detector circuit of claim 19 wherein the first reset path further comprises the first and the second transistors, and wherein the second reset path further comprises the third and the fourth transistors.

21. A phase detector circuit comprising:
first transistors coupled in series, wherein the phase detector circuit generates first and second phase error signals, wherein a first output of the phase detector circuit generating the first phase error signal is directly coupled to an input of at least one of the first transistors, wherein a second output of the phase detector circuit generating the second phase error signal is directly coupled to inputs of at least two of the first transistors, and wherein a first input clock signal is provided to an input of at least one of the first transistors; and
second transistors coupled in series, wherein the first output of the phase detector circuit is directly coupled to inputs of at least two of the second transistors, wherein the second output of the phase detector circuit is directly coupled to an input of at least one of the second transistors, and wherein a second input clock signal is provided to an input of at least one of the second transistors.

22. The phase detector circuit of claim 21 further comprising:
third transistors coupled in series, wherein an input of at least one of the third transistors is coupled to an output of the first transistors; and
fourth transistors coupled in series, wherein an input of at least one of the fourth transistors is coupled to an output of the second transistors.

23. The phase detector circuit of claim 22 further comprising:
a first logic circuit generating the first phase error signal in response to a signal generated by the third transistors; and
a second logic circuit generating the second phase error signal in response to a signal generated by the fourth transistors.

24. The phase detector circuit of claim 21 further comprising:
a third transistor coupled in parallel with one of the first transistors, wherein an input of the third transistor is coupled to the first output of the phase detector circuit; and
a fourth transistor coupled in parallel with one of the second transistors, wherein an input of the fourth transistor is coupled to the second output of the phase detector circuit.

* * * * *